United States Patent [19]
Mantl et al.

[11] Patent Number: 5,735,949
[45] Date of Patent: Apr. 7, 1998

[54] METHOD OF PRODUCING ELECTRONIC, ELECTROOPTICAL AND OPTICAL COMPONENTS

[75] Inventors: Siegfried Mantl, Jülich; Bernd Holländer, Leverkusen; Rainer Butz, Linnich-Tetz, all of Germany

[73] Assignee: Forschungszentrum Julich GmbH, Julich, Germany

[21] Appl. No.: 759,571

[22] Filed: Sep. 13, 1991

[30] Foreign Application Priority Data

Sep. 13, 1990 [DE] Germany .................. 40 29 060.3

[51] Int. Cl.[6] .................................................. C03B 1/10
[52] U.S. Cl. .................. 117/8; 117/4; 117/9; 117/930; 438/766; 438/769; 438/770
[58] Field of Search ................ 156/603, DIG. 64, 156/DIG. 73; 437/11–13, 21, 128; 117/4, 8, 9, 930; 438/766, 769, 770

[56] References Cited

U.S. PATENT DOCUMENTS

| | | | |
|---|---|---|---|
| 4,177,084 | 12/1979 | Lau et al. | 437/21 |
| 4,425,700 | 1/1984 | Sasaki et al. | 437/21 |
| 4,463,492 | 8/1984 | Maeguchi | 437/21 |
| 4,902,642 | 2/1990 | Mao et al. | 156/603 |
| 4,975,387 | 12/1990 | Prokes et al. | 156/603 |
| 5,047,111 | 9/1991 | Ishizaka et al. | 156/DIG. 73 |

FOREIGN PATENT DOCUMENTS

| | | | |
|---|---|---|---|
| 2-237109 | 9/1990 | Japan | 156/603 |
| 3-11728 | 1/1991 | Japan | 156/603 |

*Primary Examiner*—Robert Kunemund
*Attorney, Agent, or Firm*—Herbert Dubno

[57] ABSTRACT

A buried amorphous layer on a crystalline substrate with a monocrystalline surface layer, which is transformed into a mixed-crystal or chemical compound, avoids the formation of lattice defects at the interface even where the lattice parameters of the substrate and the monocrystalline layer are not matched.

11 Claims, 1 Drawing Sheet

5,735,949

METHOD OF PRODUCING ELECTRONIC, ELECTROOPTICAL AND OPTICAL COMPONENTS

FIELD OF THE INVENTION

The present invention relates to a method of producing an article which can be used in the production of electronic, electrooptical or optical components and, especially, a crystalline structure or a structure provided with a crystalline film which can be used for electronic, electrooptical or optical circuit elements. Specifically the invention relates to a method of producing a structure having a single crystalline substrate with a buried amorphous layer and a single crystalline film deposited on this substrate.

BACKGROUND OF THE INVENTION

The production of articles consisting of a crystalline substrate and a crystalline film on such substrate are known to be useful for the production of electronic, electrooptical and optical components.

The quality of the film which may be the active component of the article is affected by the structural match between substrate and film.

For example, if the lattice parameter of the applied layer is not matched to that of the substrate, lattice defects can develop at the interface in the newly formed layer and as this layer grows, these defects will propagate into the layer and can be detrimental to the electrical and especially the optical characteristics of the layer. Other approaches such as deposition upon porous silicon have not been successful in overcoming these problems.

OBJECTS OF THE INVENTION it is, therefore, the principal object of the present invention to provide an improved method of forming a monocrystalline film of desired properties on a crystalline substrate whereby the formation of lattice defects at the interface of the substrate and the newly grown film can be avoided.

SUMMARY OF THE INVENTION

These objects are attained, in accordance with the invention by providing a buried amorphous layer on a crystalline substrate and upon this buried layer a monocrystalline layer. According to the invention the monocrystalline layer is transformed into a mixed-crystal structure or a chemical compound which either corresponds to the desired crystalline film or, in its lattice structure, comes closer to the desired crystalline film than the original monocrystalline film. More particularly, the method of making a crystalline element for an electronic, electrooptical or optical component comprises:

(a) providing a crystalline substrate having a buried amorphous layer formed therein and a monocrystalline layer on the amorphous layer and separated from the substrate by the amorphous layer; and (b) transforming the monocrystalline layer into a mixed-crystal structure or a crystalline chemical compound.

In the transformation according to the invention of the monocrystalline surface layer into an alloy crystal (mixed crystal) or a crystalline chemical compound, the nonmatched crystal lattice of the surface layer is separated by the amorphous layer from the substrate and the propagation of defects from the interface is precluded as is the development of a defect network at the interface with the amorphous layer since there are no communicated stresses at the crystalline/amorphous interface.

The newly formed layer can itself be the desired product, i.e. the desired film for electrical, electronic, electrooptical or optical purposes, or can form a new base (buffer layer) for the growth of a further layer forming the desired film. In that case it constitutes a seed layer for the further monocrystalline growth of the desired film.

The transformation of the monocrystalline layer can be effected in various ways. It is, for example, possible to deposit the substances or components of the mixed-crystal or chemical compound upon the monocrystalline layer and simultaneously or subsequently to heat the layer to activate thermal diffusion and/or chemical reaction, achieving homogenization of the crystal layer or the formation of the mixed-crystal or the chemical compound.

Alternatively, the formation of the mixed-crystal or chemical compound can be attained by ion implantation in the monocrystalline layer, the ion implantation being followed by an annealing treatment. In the formation of the mixed-crystal (alloyed crystal) the concentrations of the components can be varied in the direction of growth whereby in a nonideal lattice matched system in the transformed layer, a gradient of the lattice parameter in the growth direction can result.

In a further alternative approach to transform the monocrystalline layer, the components required for formation of the mixed-crystal or the chemical compound can be deposited by epitaxy and, during or following the epitaxial deposition, an annealing treatment can be carried out.

It has been found that, with the present invention, the lattice parameters of the transformed layer can differ very significantly from that of the substrate material, but inspire of that, a substantially higher crystal quality of the transformed crystal layer can be obtained than with other approaches. This layer can have higher temperature resistance for example.

Through the use of a substrate with an electrically insulating buried amorphous layer, for example with SIMOX wafers the new film is dielectrically isolated from the substrate, the articles made in accordance with the invention have all of the inherent advantages of the SIMOX structure (isolation electronics) for microelectronic applications, for example high frequency properties.

BRIEF DESCRIPTION OF THE DRAWING

The above and other objects, features and advantages of our invention will become more readily apparent from the following description, reference being made to the accompanying highly diagrammatic drawing in which.

SPECIFIC DESCRIPTION

Figure 1:
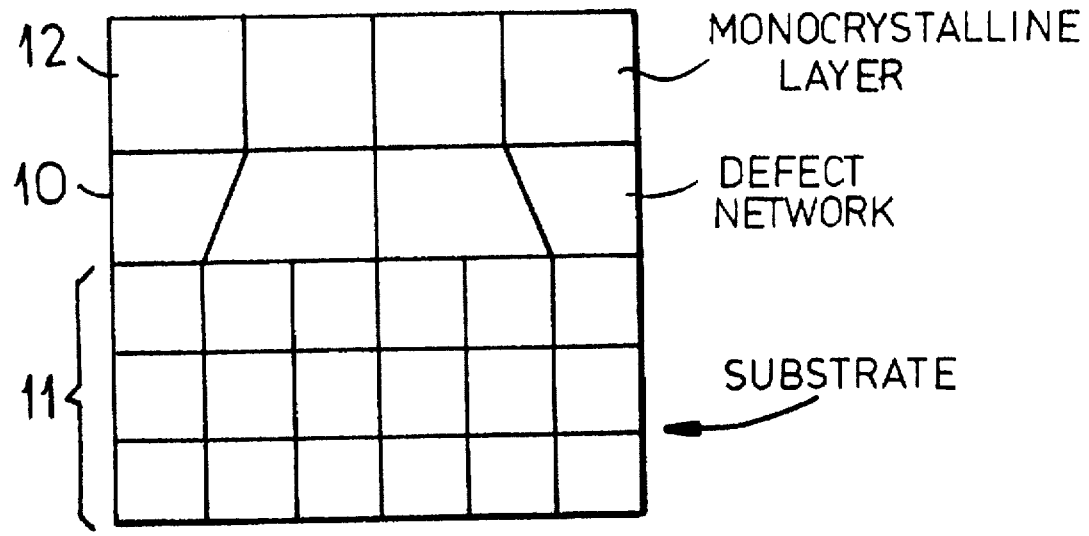
FIG. 1 is a diagram illustrating the prior art approach in which a monocrystalline layer is deposited by heteroepitaxy on a substrate which has not been lattice matched therewith.
Figure 2:
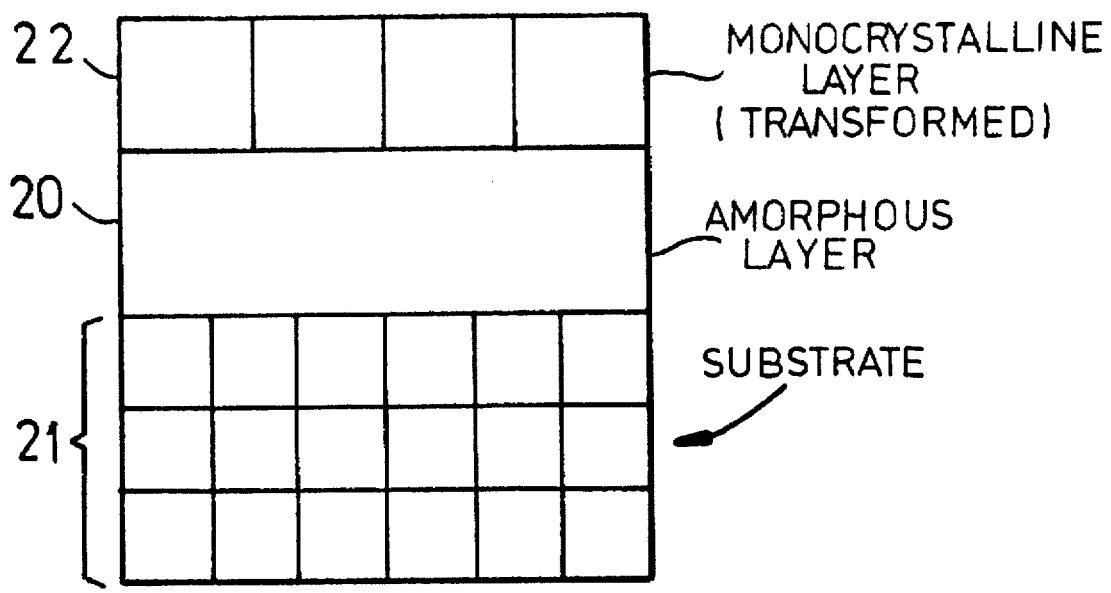
FIG. 2 is a diagram showing the approach taken by the invention.

As can be seen from FIG. 1, it is not possible to grow a monocrystalline surface layer of unmatched lattice parameters onto the crystalline structure without the development of a defect network at the interface 10 between the substrate 11 and the monocrystalline layer 12. In the diagrams of FIGS. 1 and 2 the difference in lattice parameters is represented by boxes of different sizes representing the crystalline cells.

By comparison, where an amorphous layer 20 is provided with the substrate 21 and the monocrystalline layer 22, the generation of a dislocation network is avoided.

The monocrystalline layer or film 22 can thus be modified as described to form the mixed-crystal or compound.

EXAMPLE 1

Monocrystalline Si-Ge mixed-crystal on SiO₂ insulating layer.

The substrate is a SIMOX-wafer (SIMOX=separation by implantation of oxygen). This commercially available substrate consists of a silicon wafer having a buried amorphous silicon dioxide layer and a monocrystalline silicon surface layer.

The monocrystalline silicon surface layer is initially thinned to a thickness of 20 nm by plasma etching. The substrate thus prepared is then heated at 850° C. (5 min.) in a molecular beam epitaxy (MBE) apparatus as is common in Si epitaxy to provide a perfect and clean surface. Si and Ge are deposited in a ratio of 80:20 at 450° C. With subsequent annealing at 1100° C. for 30 seconds there is a complete homogenization of the Si seed layer and the deposited Si-Ge film. The resulting Si-Ge layer can be used directly for Si-Ge electrooptical devices or can serve as an intermediate layer (buffer layer) for further epitaxial growth of heterostructures and superlattices.

EXAMPLE 2

Monocrystalline cobalt silicide on silicon dioxide.

The starting material is again a silicon substrate with buried SiO₂ layer, namely, a SIMOX wafer.

The monocrystalline Si surface layer is first chemically cleaned and then thinned to the desired thickness by plasma etching. In a vapor deposition apparatus under ultra high vacuum conditions, Co is deposited. Silicide formation occurs during thermal treatment in the apparatus. The layer thicknesses depend upon the materials used. CoSi₂ resulted when a 100 nm Si starting layer was coated with 28 nm of a Co film after solid phase epitaxy with a silicide layer thickness of about 100 nm. For Complete reaction of the CoSi₂ layer a temperature of 600° C. and 30 minutes was used. The resulting component had a monocrystalline silicide layer of especially high electrical and crystalline quality on an electrically insulating SiO₂ layer.

We claim:

1. A method of making a crystalline element for an electronic, electrooptic or optical component, comprising:

(a) providing a crystalline substrate having a buried amorphous layer formed therein and a monocrystalline layer on said amorphous layer and separated from said substrate by said amorphous layer; and (b) transforming said monocrystalline layer into a mixed-crystal structure or a crystalline chemical compound, whereby said amorphous layer is interposed between said substrate and said structure or compound and remains in the crystalline element of said component.

2. The method defined in claim 1 wherein the layer transformed in step (b) forms a desired crystalline film.

3. The method defined in claim 1 wherein the layer transformed in step (b) forms a crystalline film close in lattice structure to a desired crystalline film; said method further comprising the step of applying to the layer transformed in step (b) said desired crystalline film.

4. The method defined in claim 1 wherein the transforming of said monocrystalline layer in step (b) is effected by depositing at least one substance of said mixed-crystal structure or said crystalline chemical compound and applying heat to effect a thermal diffusion and/or a chemical reaction for homogenization of the resulting crystalline layer, the formation of the mixed-crystal structure or the formation of the compound.

5. The method defined in claim 4 wherein the heat is applied simultaneously with the deposition of said substance.

6. The method defined in claim 4 wherein the heat is applied subsequent to the deposition of said substance.

7. The method defined in claim 1 wherein the transformation in step (b) includes ion implantation in said monocrystalline layer.

8. The method defined in claim 7 further comprising annealing the monocrystalline layer after ion implantation.

9. The method defined in claim 1 wherein the formation of the mixed-crystal structure or said crystalline compound is effected by depositing a substance on said monocrystalline layer by epitaxy and, during or after the epitaxial deposition, said monocrystalline layer is subjected to an annealing heating.

10. The method defined in claim 1, further comprising the step of modifying a thickness of said monocrystalline layer prior to transformation in step (b).

11. The method defined in claim 10 wherein the modification of the thickness of said monocrystalline layer is effected by plasma etching.

* * * * *